United States Patent [19]

Pelletier et al.

[11] Patent Number: 4,568,839
[45] Date of Patent: Feb. 4, 1986

[54] ANALOG BIPOLAR CURRENT SWITCH

[75] Inventors: Joël A. Pelletier, Les Essarts Le Roi; Robert Breuillard, Deuil la Barre, both of France

[73] Assignee: U.S. Phillips Corporation, New York, N.Y.

[21] Appl. No.: 412,058

[22] Filed: Aug. 27, 1982

[30] Foreign Application Priority Data

Sep. 25, 1981 [FR] France ................................ 8118099

[51] Int. Cl.$^4$ ...................... H03K 17/60; H03K 17/56
[52] U.S. Cl. .................................. 307/255; 307/242; 307/248
[58] Field of Search ............... 307/248, 253, 255, 254, 307/270, 317 R, 477, 499, 544, 459, 239; 357/92

[56] References Cited

U.S. PATENT DOCUMENTS

| | | | |
|---|---|---|---|
| 3,315,100 | 4/1967 | Anodei | 307/454 |
| 3,808,461 | 4/1974 | Maximov et al. | 307/317 R |
| 3,814,951 | 6/1974 | Mar | 307/318 |
| 3,935,478 | 1/1976 | Okada et al. | 307/296 |
| 4,342,925 | 8/1982 | Schick | 307/270 |
| 4,380,711 | 4/1983 | Cunningham | 307/499 |

FOREIGN PATENT DOCUMENTS 1379591 1/1975 United Kingdom .

OTHER PUBLICATIONS

Froment, "Analog Gate Circuit", IBM Tech. Bulletin, vol. 18, No. 12, May 76.

Primary Examiner—John S. Heyman
Assistant Examiner—Timothy P. Callahan
Attorney, Agent, or Firm—Robert T. Mayer; Steven R. Biren

[57] ABSTRACT

An analog current switch in bipolar technology in which an intermediate transistor ($T_i$), which isolates the current injector (S) from the switching diode ($D_c$), is biassed by means of a transistor (T) whose collector, which is coupled to its base, is connected to the base of the intermediate transistor ($T_i$) and to the anode of a diode (D), the emitters of (T) and ($T_i$) as well as the cathodes of (D) and ($D_c$) being interconnected.

3 Claims, 3 Drawing Figures

ANALOG BIPOLAR CURRENT SWITCH

BACKGROUND OF THE INVENTION

The invention relates to an analog current switch in bipolar technology in which the switching circuit comprises a switching diode and an intermediate isolating transistor whose emitter is connected to a current source and whose collector is connected to the anode of said switching diode, the emitter of said intermediate transistor, the anode and the cathode of said switching diode, respectively, constituting the signal input, the switching signal input and the signal output of said switch. The switching signal either turns on said switching diode, in which case the current injected into said intermediate transistor by said source is transferred towards said signal output, or turns off said switching diode, in which case the current is applied to said switching-signal input.

Such a switching circuit is known from British Patent Specification No. 1,379,591, in which circuit the intermediate transistor with a low output capacitance is employed for isolating the current source from the switching diode and thereby reducing the stray capacitance of the device. In addition, for biassing said transistor it is necessary to apply a fixed potential to its base, which potential is supplied by an external voltage source.

SUMMARY OF THE INVENTION

It is the object of the invention to replace said external bias source by an integrated circuit which provides the bias for the intermediate transistor. For this purpose, according to the invention, the said bias is provided by a second transistor of the same conductivity type, whose collector, which is coupled to its base, is connected to the base of said intermediate transistor and to the anode of a second diode, the emitters of said second transistor and said intermediate transistor being interconnected and the cathodes of said second diode and said switching diode being interconnected.

BRIEF DESCRIPTION OF THE DRAWING

The invention will now be described in more detail, by way of example, with reference to the accompanying drawing, in which.

DESCRIPTION OF THE PREFERRED EMBODIMENTS

Figures 1A, 1B:
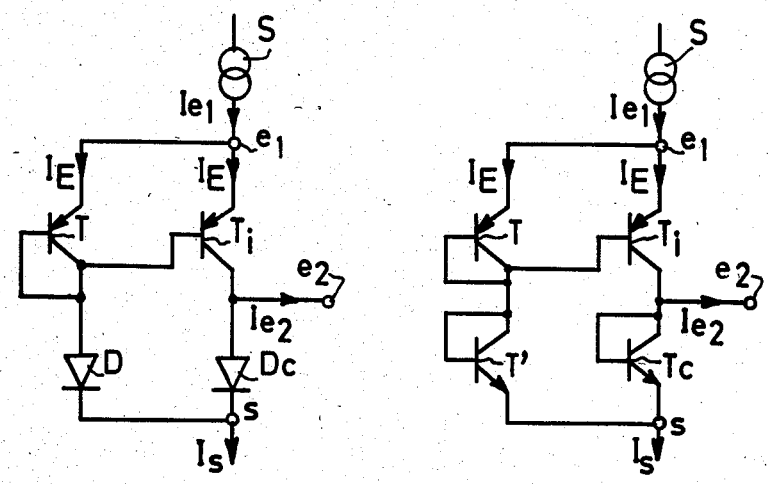
FIG. 1a shows the diagram of an analog current switch in accordance with the invention.
FIG. 1b shows the diagram of the same switch in the form of an integrated circuit.

In FIG. 1a the switching circuit comprises the switching diode $D_c$ and the intermediate transistor $T_i$ of the PNP type which isolates the current source S from the diode $D_c$, the emitter of $T_i$ being connected to S and its collector being connected to the anode of $D_c$. The emitter of $T_i$, and the anode and the cathode of $D_c$ respectively, consitute the signal input $e_1$, the switching signal input $e_2$, and the signal output s of the switch.

In order to ensure that the current $I_{e1}$ injected at the input $e_1$ by the source S is transferred to the output s or is fed to the switching input $e_2$ depending on the value of the switching signal applied to $e_2$, transistor $T_i$ should be biassed so as to be permanently conductive. In the prior art said bias is provided by an external voltage source which maintains the base of $T_i$ at a negative potential. The injected current $I_{e1}$ is equal to the emitter current $I_E$ of $T_i$. The current $I_s$ transferred from s or the current $I_{e2}$ fed to $e_2$ is then equal to the collector current $I_E$ of $T_i$:

$$I_s = I_{e2} = \alpha I_E = \beta/\beta + 1 I_E$$

where $\alpha$ and $\beta$ are the current gain factors of $T_i$ in common-base and in common-emitter arrangement respectively.

It is possible to dispense with the external bias source by self-biassing $T_i$, which in accordance with the invention is achieved by means of the PNP transistor T whose collector, which is coupled to its base, is connected to the base of $T_i$ and to the anode of the diode D, the emitters of T and $T_i$ being interconnected as are the cathodes of D and $D_c$.

The transistors $T_i$ and T, which are assumed to be identical, have the same current and gain characteristics. The injected current $I_{e1}$ is consequently equal to the sum $2I_E$ of the emitter currents of $T_i$ and T. The derived current $I_{e2}$ is always equal to $\alpha I_E$, but for the current being transferred, $I_s$, the bias current $I_o$ of T is permanently superimposed on the collector current $\alpha I_E$ of $T_i$. This current $I_o$ is the sum of the base currents of $T_i$ and T and of the collector current of $T_i$:

$$I_o = 2(1-\alpha)I_E + \alpha I_E = (2-\alpha)I_E.$$

This yields:

$$I_s = \alpha I_E + (2-\alpha)I_E.$$

The bias voltage of the circuit across its input terminal $e_1$ and output terminal s is equal to twice the bias voltage of the base-emitter diode of a transistor, i.e. approximately 1.6 V.

In an embodiment of the switch in accordance with the invention in the form of an integrated circuit, which is represented schematically in FIG. 1b, the diodes $D_c$ and D are replaced by the base-emitter diodes of the two NPN-transistors $T_c$ and T', whose collectors, which are coupled to the bases, are connected to the collectors of $T_i$ and T respectively and whose emitters are connected to the signal output.

The operation of the switches which are represented schematically in FIGS. 1a and 1b is influenced by the value of the bias current, which cannot be neglected and which permanently forms a component of the current being transferred. The expression for $I_s$ calculated in the foregoing shows that said permanent component is of the same order of magnitude as the intermittent component, which is equal to the collector current of $T_i$, which makes it impossible to obtain a "O" in the signal being transferred. This drawback is substantially eliminated by the use of the circuit which is represented schematically in FIG. 2 and which is biassed in accordance with the invention by means of the transistors T and T', which circuit comprises n identical switching circuits $(T_{c1} - T_{i1}, \ldots T_{cn} - T_{in})$ as shown in the diagram of FIG. 1b, comprising n signal inputs $e_{11}, e_{12}, \ldots e_{1n}$ which are interconnected and connected to the current source S, the n bases of the transistors $T_{i1}, T_{i2}, \ldots T_{in}$ which are connected to the collectors of T and T', and the n signal outputs $s_1, s_2, \ldots s_n$ which are connected to one terminal of a resistor R whose other terminal is connected to ground.

The current $I_e$ injected by the current source S, which current is the sum of the emitter currents of the n transistors $T_{i1}$, $T_{i2}$, ... $T_{in}$ and of the transistor T, is equal to $(n+1)I_E$ if all the transistors are identical. If the n switching diodes formed by the base-emitter junctions of the transistors $T_{c1}$, $T_{c2}$, ... $T_{cn}$ receive the switching signal of such a value at their switching-signal input terminals $e_{21}$, $e_{22}$, ... $e_{2n}$ that they are simultaneouly switched to $p \leq n$ non-conductive states and $n-p$ conductive states, the sum of the currents applied to the corresponding switching signal inputs is $I_m = p\beta/\beta + 1 I_E$. The bias current $I_o$ is the sum of the base and collector currents of T and the base currents of $T_{i1}$, $T_{i2}$, ... $T_{in}$. Further calculations then yield:

$$I_o = \left(1 - \frac{\beta}{\beta+1} \frac{n}{n+1}\right)(n+1)I_E$$

The transferred current $I_s$ is equal to the sum of the currents in the $n-p$ switching diodes which are conductive, on which sum the bias current is superimposed.

$$I_s = (n-p)\frac{\beta}{\beta+1} I_E + \left(1 - \frac{\beta}{\beta+1} \frac{n}{n+1}\right)(n+1)I_E$$

Depending on the consecutive values of p this yields a specific voltage across the resistor R.

Such a circuit may advantageously be utilized for the formation of digital-to-analog converters.

Figure 2:
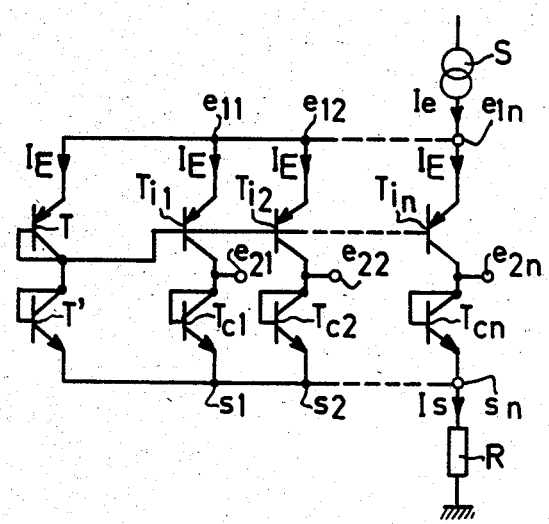
FIG. 2 is the diagram of an arrangement of n identical switches in accordance with the diagram shown in FIG. 1b, which arrangement may be used for the digital-to-analog conversion of the signal.

The circuit of FIG. 2 may be regarded as an attenuator whose transfer coefficient a may be defined as the ratio of the sum of the currents $I_m$ drained to ground to the current $I_e$ injected into the line. The useful current $I_s$ being transferred is written as:

$$I_s = I_e - I_m = I_e\left(1 - \frac{I_m}{I_e}\right) = I_e(1-a).$$

From this the attenuation $I_s/I_e = 1-a$ introduced by the line is subtracted. Furthermore, the reflection coefficient $\rho$ of the line is defined by the ratio of the current $I_m$ drained to the bias current $I_o$.

Taking into account the expressions obtained for $I_e$, $I_m$ and $I_o$, the values of the transfer and reflection coefficients are:

$$a = \frac{I_m}{I_e} = \frac{p}{n+1} \frac{1}{1+\frac{1}{\beta}}, \rho = \frac{I_m}{I_o} = \frac{p}{1+\frac{n+1}{\beta}}$$

If the $n+1$ transistors $I_i$ and T are not strictly identical, then $$a = \sum_p a_j \text{ where } a_j = \frac{I_{e2j}}{I_e},$$

$I_{e2j}$ being the current applied to the switching signal input $e_{2j}$. The useful current $I_s$ transferred is then:

$$I_s = I_e\left(1 - \sum_p a_j\right).$$

What is claimed is:
1. An analog current switch in bipolar technology in which a switching circuit comprises a switching diode and an intermediate transistor having its emitter connected to a current source and its collector connected to the anode of said switching diode, the emitter of said intermediate transistor comprising the signal input terminal of said switching circuit, the anode and cathode of said switching diode respectively comprising the switching signal input terminal and signal output terminal of said switching circuit, a switching signal applied to said switching signal input terminal for either turning on said switching diode, in which case the current injected into said intermediate transistor by said current source is transferred to said signal output terminal, or for turning off said switching diode, in which case said current is applied to said switching signal input terminal, said intermediate transistor being biased by a second transistor of the same conductivity type as said intermediate transistor, said second transistor having its collector connected to its base and to the base of said intermediate transistor and to the anode of a second diode, the emitter of said second transistor and said intermediate transistor being interconnected and the cathodes of said second diode and switching diode being interconnected.

2. An analog current switch as claimed in claim 1, wherein said second diode comprises a third transistor of opposite conductivity type to that of said second transistor and having its base and collector interconnected.

3. An analog current switch in bipolar technology in which a switching circuit comprises n switching diodes and n corresponding intermediate transistors, each intermediate transistor having its emitter connected to a common current source and its collector connected to the anode of its corresponding switching diode, the cathodes of said switching diodes being connected together and the bases of said intermediate transistors being connected together, the emitters of said intermediate transistors comprising the signal input terminal of said switching circuit, the anodes and cathodes of said switching diodes respectively comprising the switching signal input terminals and the signal output terminal of said switching circuit, a switching signal applied to a selected switching signal input terminal for either turning on the associated switching diode, in which case the current injected into the associated intermediate transistor by said current source is transferred to said signal output terminal, or for turning off said selected switching diode, in which case said current is applied to said selected switching signal input terminal, said intermediate transistors being biased by a further transistor of the same conductivity type as said intermediate transistors, said further transistor having its collector connected to its base and to the bases of said intermediate transistors and to the anode of a further diode, the emitters of said further transistor and said intermediate transistors being interconnected and the cathodes of said further diode and said switching diodes being interconnected.

* * * * *